Sept. 4, 1951 R. D. HUNTOON 2,566,333

FREQUENCY SELECTIVE FEEDBACK AMPLIFIER

Filed June 24, 1946 2 Sheets-Sheet 1

INVENTOR
ROBERT D. HUNTOON

BY R. D. O'Brien

ATTORNEY

Sept. 4, 1951 R. D. HUNTOON 2,566,333

FREQUENCY SELECTIVE FEEDBACK AMPLIFIER

Filed June 24, 1946 2 Sheets-Sheet 2

INVENTOR
ROBERT D. HUNTOON

BY

ATTORNEY

Patented Sept. 4, 1951

2,566,333

UNITED STATES PATENT OFFICE 2,566,333

FREQUENCY SELECTIVE FEEDBACK AMPLIFIER

Robert D. Huntoon, Silver Spring, Md., assignor to the United States of America as represented by the Secretary of the Navy Application June 24, 1946, Serial No. 678,754

1 Claim. (Cl. 179—171)

(Granted under the act of March 3, 1883, as amended April 30, 1928; 370 O. G. 757)

The present invention relates to electrical signal translating systems and, while it has a considerable range of prospective application, it relates more particularly to audio-frequency amplifiers of the type employing selective feedback for obtaining desired frequency-response characteristics.

It is an object of the invention to provide an improved signal translating system of the character indicated and having a relatively high gain at a particular input-signal frequency or narrow band of frequencies.

It is also an object of the invention to provide an improved signal translating system having a relatively sharp high frequency cutoff and characterized by sharp discrimination against input signals of frequencies higher than a desired critical frequency.

It is a further object of the invention to provide an improved signal amplifier incorporating few and conventional components.

It is an additional object of the invention to provide an improved signal amplifier having a very low gain for high frequency input signals and a normal gain for low frequency signals.

A paramount object of the present invention is to provide a signal amplifier which includes a feedback network having a transmission characteristic dependent upon frequency and is of light, compact and reliable construction.

Figures 1, 2:
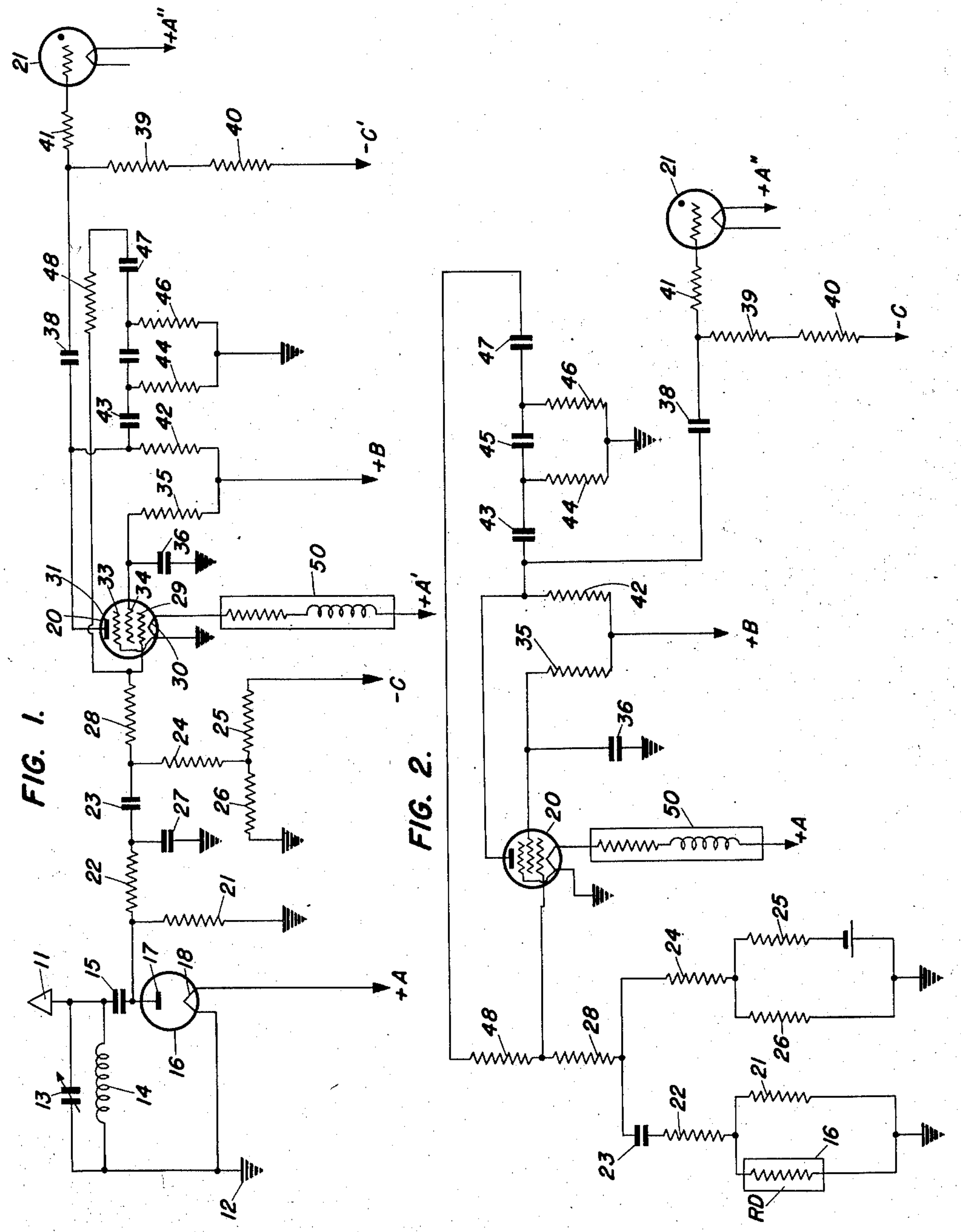
Figure 3:
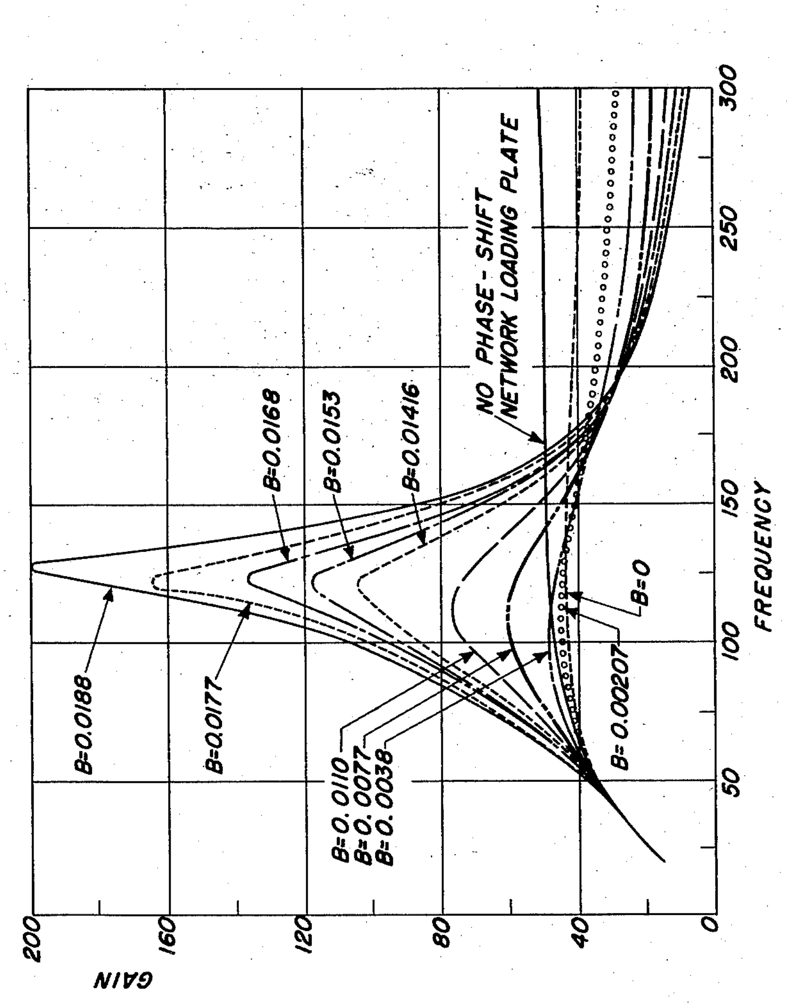

For a better understanding of the present invention, together with other and further objects thereof, reference is made to the following description taken in connection with the accompanying drawings in which: Fig. 1 is a circuit schematic of a complete electrical signal translating system including a preferred embodiment of the present invention; Fig. 2 is a circuit schematic similar to Fig. 1 and in which equivalent circuit parameters are substituted for the diode detector and associated circuits there illustrated, certain of the amplifier circuits being rearranged for the purpose of facilitating the description thereof; Fig. 3 comprises a set of curves showing the effects of various values of the feedback voltage fraction B on the frequency-response characteristic of a typical amplifier of the type included in the Fig. 1 embodiment.

Referring now specifically to Fig. 1 the signal translating system there illustrated includes: an antenna-ground system 11, 12 for intercepting modulated radio-frequency signals; a tuning system comprising a variable capacitor 13 and an inductor 14, coupled by a capacitor 15 to a diode detector tube 16; a detector arrangement for deriving the modulation components of received radio-frequency signals and including the above-mentioned tube, which has an anode 17 and a cathode 18; an amplifier including a pentode tube 20; a gas-filled grid control tube of the Thyratron type 21; and associated circuits which cooperate with the above-described elements to cause tube 21 to be "triggered" and to perform useful work upon reception of signals having a desired audio-frequency characteristic intercepted by the antenna ground system 11, 12, but which cause tube 21 to remain nonconductive upon reception of signals not so characterized.

Connected between anode 17 and ground is a resistor 21 provided for the purpose of enabling the detector to lose charge and follow modulation. The audio signals are brought out from the detector to the amplifier through a resistor 22, which cooperates with capacitor 27 to form a filter that rejects radio-frequency signals but passes audio-frequency signals. Input signals to be amplified are applied by impedance means to the input circuit of tube 20, which comprises a cathode 30 of the filamentary type and a control electrode 29. This impedance means includes resistor 22, a coupling capacitor 23, and a network comprising resistors 24, 25, and 26, the network being effectively disposed in shunt relationship with respect to the above-mentioned input circuit. These three resistors have a common junction. The terminal of resistor 26 remote from the junction is grounded and the remote terminal of resistor 25 is connected to an appropriate grid bias potential source (not shown) indicated at —C. An additional resistor 28, serially related to the network comprising resistors 24, 25, and 26, is connected at one terminal thereof to a control electrode 29 and at the other terminal thereof to the junction of condenser 23 and resistor 24. It will be understood that resistors 24, 25, and 26 may be replaced by a single equivalent resistor. Resistors 25 and 26 function as an expedient for dropping the potential of the source —C to the desired grid bias. Representative of the types of vacuum tubes which may be employed as element 20 are the Sylvania SA781A and the Raytheon QF206. Tube 20 includes a suppressor grid electrode 33 connected to filament 30, a screen grid electrode 34, and an anode 31. Screen 34 is coupled to an appropriate source of space current and anode potential (not shown) indicated at +B, through a screen dropping resistor 35. In order to prevent the degenerative effect of screen voltage changes on amplifier gain an audio-frequency by-pass condenser 36 is provided between screen and ground. Anode potential is provided by coupling anode 31 through resistor 42 to source +B.

The output circuit of tube 20 is coupled through blocking and coupling capacitor 38, grid resistors 39 and 40, and resistor 41, to a control electrode of the tube 21 thereby to apply the amplifier output thereto.

Filament heating currents for tubes 16, 20, and 21, are furnished by appropriate current sources (not shown) indicated as +A, +A′ and +A″. A choke 50 is included in circuit between source +A′ and filament 30.

The above-described elements are individually conventional in character and well known to those skilled in the art, so that further description thereof is deemed unnecessary. My invention resides in the feedback and signal mixing network now to be described and in its combination with the amplifier and detector. According to one feature thereof a feedback network, having a transmission characteristic which depends upon frequency and including a resistor connected to the control electrode of tube 20, is provided. According to another feature of my invention the feedback signal means includes the portion 24, 25, and 26 of the impedance coupling means above described, the additional impedance 28 serially related to that portion, and resistance-capacitance elements for coupling the output circuit of tube 20 to its input circuit. Other features of my invention reside in the inclusion of the alternating current resistance of detector tube 16 as a parameter in a voltage divider network forming a part of the feedback signal means.

In accordance with the above-mentioned features, there is coupled to the output circuit of tube 20 a series capacitance-shunt resistance phase shifting and attenuating network having a transmission characteristic which varies with frequency. This network is similar in some respects to those described in the proceedings of the Institute of Radio Engineers, February 1941, pages 43 to 49, inclusive, an article by E. L. Ginzton and L. M. Hollingsworth, but differs therefrom in important respects presently to be pointed out. The last-mentioned network is coupled to plate resistor 42. It comprises three meshes. The first mesh consists of a capacitor 43 and a resistor 44. The second mesh consists of a capacitor 45 and a resistor 46. The third mesh consists of a capacitor 47 and a complex impedance. Referring now to Fig. 2 it will be seen that this impedance includes all of the elements between the terminal of resistor 48, remote from that connected to condenser 47, and ground. Specifically it includes, successively, resistor 48, resistor 28 in series relation thereto and two series-parallel branches, one of which includes the above-described elements 22, 23, 21, and the alternating current plate resistance $R_d$ of tube 16, and the other of which includes the elements 24, 25, and 26. Thus this complex voltage-divider signal-combining network for coupling the output and input circuits of tube 20 includes as a parameter the plate impedance of the detector tube 16. In this manner the feedback signal is introduced across resistor 28 in series with resistor 24 and the parallel combination of resistors 25 and 26 and cooperates with the input signal applied across resistor 24 and this parallel combination to determine the frequency response characteristic of tube 20.

Referring now to the operation of the above-described system it will be assumed that modulated radio-frequency energy is intercepted by the antenna ground system and applied to the detector tube 16, which in turn derives the modulation components thereof and applies an audio-frequency signal to the input of amplifying tube 20. The signal translating system has such operation that the gain of tube 20 is very low for audio frequencies above a critical frequency, but high at a predetermined frequency, so that tube 21 may be made to fire upon the reception of signals of the last-mentioned frequency and to remain nonconductive for received signals of frequencies in excess of the critical value.

An amplifier output signal appears across the plate resistor 42. It is applied to the Thyratron by way of condenser 38 and resistors 39, 40, and 41. Output voltage appearing across resistor 42 is coupled back to the input circuit of the amplifier tube through the phase shifting network comprising elements 42, 43, 44, 45, 46, 47, 48, 28, 24, 25, 26, 23, 22, 21, and the equivalent resistor RD, or alternating current plate impedance of the diode. There is one frequency for which the phase-shifting network introduces a phase shift of 180 degrees so that the feedback signal applied under this condition to the input circuit is in phase with the input signal. At this frequency feedback increases the gain of the amplifier and acts regeneratively. At higher frequencies the phase shift is less than 180° and the attenuation of the feedback signal is lesser, so that a strong out-of-phase signal is fed back to the input, thereby greatly to reduce the gain of the amplifier. This result follows from the fact that the reactance of the series condensers decreases as frequency is increased. At lower frequency the transmission characteristic of the attenuating network is such that the phase shift is greater than 180 degrees so that the tendency of the feedback signal is then to reduce amplifier gain. However, at low frequencies the attenuation of the feedback network is so great that the effect of feedback is negligible, and the low frequency response of the amplifier is similar to what it would be without feedback. By proper adjustment of the voltage division of the voltage divider network, sufficient feedback may be introduced to provide the desired shaping of the response characteristic without causing oscillation.

The impedance of the input circuit determines in part the amount of amplifier feedback and hence the gain thereof.

Referring now specifically to Fig. 3 of the drawing there are illustrated curves showing the effect of various values of the fraction B of the output voltage, fed back through the feedback network to the amplifier input circuit, on the amplifier frequency-response characteristic. These curves represent data empirically obtained from test of a circuit in accordance with Fig. 1 having the parameters hereinbelow listed in Table I. Table II contains altered values of circuit components which may be employed for the purpose of making such an amplifier peak at an input-signal audio frequency of 60 cycles per second. The fraction B and the theory of feedback are defined and explained in detail in the following publications: 1. Terman, Radio Engineering, New York, 1937, pages 248–256; 2. An article entitled "Some Applications of Negative Feedback With Particular Reference to Laboratory Equipment," by F. E. Terman, R. R. Buss, W. R. Hewlett, and F. B. Cahill, Proceedings of the Institute of Radio Engineers, October 1939, pages 649–655; 3. A publication entitled "Frequency Discrimination by Inverse Feedback," by George H. Fritzinger, Proceedings of the Institute of Radio Engineers, February 1938, pages 207–225; 4. Theory and Application of Electron Tubes, Reich, New York, 1944, pages 197–209 inclusive; 5. A publication entitled "A New Type of Selective Circuit and Some Applications," H. H. Scott, Proceedings of the Institute of Radio Engineers, February 1938, pages 226–235.

While not proposing to limit the invention to any specific parameters, the following have been found practicable:

TABLE I

*Circuit parameters—for QF 206 pentode*

| Component: | | Value |
|---|---|---|
| $R_d$ | megohm | 0.05 |
| $R_{22}$ | do | 0.10 |
| $R_{21}$ | do | 1.0 |
| $R_{24}$ | do | 1.0 |
| $R_{28}$ | do | 0.15 |
| $R_{48}$ | do | 1.0 |
| $R_{35}$ | do | 3.3 |
| $R_{42}$ | do | 0.68 |
| $R_{44}$ | do | 1.0 |
| $R_{46}$ | do | 1.0 |
| $R_{26}$ | do | 1.0 |
| $R_{25}$ | do | 3.3 |
| $R_{39}$ | do | 2.2 |
| $R_{40}$ | do | 0.10 |
| +A[1] | volts | 1.2 |
| −C | do | −6.0 |
| +B | do | 135 |
| −C[1] | do | −6.0 |
| $C_{23}$ | μf | 0.02 |
| $C_{36}$ | do | .01 |
| $C_{43}$ | do | .001 |
| $C_{45}$ | do | .001 |
| $C_{38}$ | do | .002 |
| $C_{47}$ | μμf | 250 |

*Values and tolerances for circuit components*

| Component: | Value |
|---|---|
| $L_{50}$ | 7.5-ohm choke |

*Altered values for SA 781A pentode*

| Component: | | Value |
|---|---|---|
| $R_{35}$ | megohm | 4.7 |
| $R_{39}$ | do | 1.0 |
| $C_{38}$ | μf | 0.005 |

TABLE II

*Altered values of circuit components to make amplifier peak at 60 cycle sec.*

| QF 206 | | | | SA 781A | | | |
|---|---|---|---|---|---|---|---|
| Component | Value (megohm) | Component | Value (μf.) | Component | Value (megohm) | Component | Value (μf.) |
| $R_d$ | 0.05 | $C_{23}$ | 0.04 | $R_{35}$ | 5.0 | $C_{38}$ | 0.01 |
| $R_{26}$ [1] | | $C_{36}$ | .02 | $R_{44}$ | 1.5 | | |
| $R_{25}$ [1] | | $C_{43}$ | .002 | $R_{39}$ | 1.0 | | |
| $R_{35}$ | 3.0 | $C_{45}$ | .002 | $R_{48}$ | 0.75 | | |
| $R_{42}$ | 0.75 | $C_{47}$ | .0005 | | | | |
| $R_{39}$ | 2.0 | $C_{38}$ | .005 | | | | |
| $R_{40}$ | 0 | | | | | | |
| $R_{24}$ | 2.0 | | | | | | |

[1] Replaced by 1.5-volt battery to ground.

While there has been shown and described what is at present considered to be a preferred embodiment of the invention, it will be obvious to those skilled in the art that various modifications and changes may be made therein without departing from the spirit thereof; and it is intended in the appended claim to cover all such changes and modifications as fall within the true spirit and scope of the invention.

The invention herein described may be manufactured and used by or for the Government of the United States of America for governmental purposes without the payment of any royalties thereon or therefor.

I claim:

A frequency selective amplifier having an input circuit of internal impedance variable with frequency, and an output circuit, said amplifier comprising an electron tube having an anode, cathode and control electrode, a first filter network, a series resistance unit connecting said control electrode to the input circuit through said filter network whereby to pass audio frequencies only, a second filter network interconnecting at least a portion of said output circuit with said input circuit at the junction of said resistance unit and control electrode, said second filter network including at least three stages of series capacitance, shunt resistance for a first and second capacitance of said stages, and a complex shunt impedance for said capacitance of said last stage including said series resistance unit and said internal impedance whereby to provide a frequency responsive voltage divider feedback circuit wherein the frequency variable impedance of said input circuit will in part determine the amount of feedback of said amplifier.

ROBERT D. HUNTOON.

REFERENCES CITED

The following references are of record in the file of this patent:

UNITED STATES PATENTS

| Number | Name | Date |
|---|---|---|
| 2,173,426 | Scott | Sept. 19, 1939 |
| 2,178,072 | Fritzinger | Oct. 31, 1939 |
| 2,229,702 | Larsen | Jan. 28, 1941 |
| 2,246,158 | Worcester, Jr. | June 17, 1941 |
| 2,282,382 | Root | May 12, 1942 |
| 2,282,383 | Root | May 12, 1942 |